United States Patent [19]
Benedikt et al.

[11] Patent Number: 5,778,115
[45] Date of Patent: Jul. 7, 1998

[54] ARRANGEMENT FOR SWITCHING A HIGH-VOLTAGE SWITCH BY OPTICAL ENERGY

[75] Inventors: Walter Benedikt, Kornwestheim; Manfred Vogel, Ditzingen; Werner Herden, Gerlingen; Johann Konrad, Tamm, all of Germany

[73] Assignee: Robert Bosch GmbH, Stuttgart, Germany

[21] Appl. No.: 669,294

[22] PCT Filed: Jun. 2, 1995

[86] PCT No.: PCT/DE95/00704

§ 371 Date: Nov. 4, 1996

§ 102(e) Date: Nov. 4, 1996

[87] PCT Pub. No.: WO96/17169

PCT Pub. Date: Jun. 6, 1996

[30] Foreign Application Priority Data

Nov. 30, 1994 [DE] Germany ............ 44 42 545.7

[51] Int. Cl.⁶ .................................................. G02B 6/42
[52] U.S. Cl. .............................. 385/16; 385/147; 385/27; 385/44; 385/48
[58] Field of Search ................... 385/16, 15, 17, 385/18, 19, 22, 31, 39, 44, 48, 147, 27

[56] References Cited

U.S. PATENT DOCUMENTS 5,237,969  8/1993  Sakin .................. 123/143 B

FOREIGN PATENT DOCUMENTS

0377619B1  3/1989  European Pat. Off. .
4139823C2  10/1993  Germany .

*Primary Examiner*—Phan T. H. Palmer
*Attorney, Agent, or Firm*—Michael J. Striker

[57] ABSTRACT

An arrangement for switching a high-voltage switch by optical energy is proposed. The high-voltage switch comprises a number of controllable semiconductor elements, which switch through when illuminated with light. The light energy is transmitted via a light guide or optical fiber rod, and the angle between the light guide or optical fiber rod and the high-voltage switch is from 5° to 20°, and the light guide or optical fiber rod is cut obliquely on its end toward the high-voltage switch, producing an elliptical cross section.

6 Claims, 1 Drawing Sheet

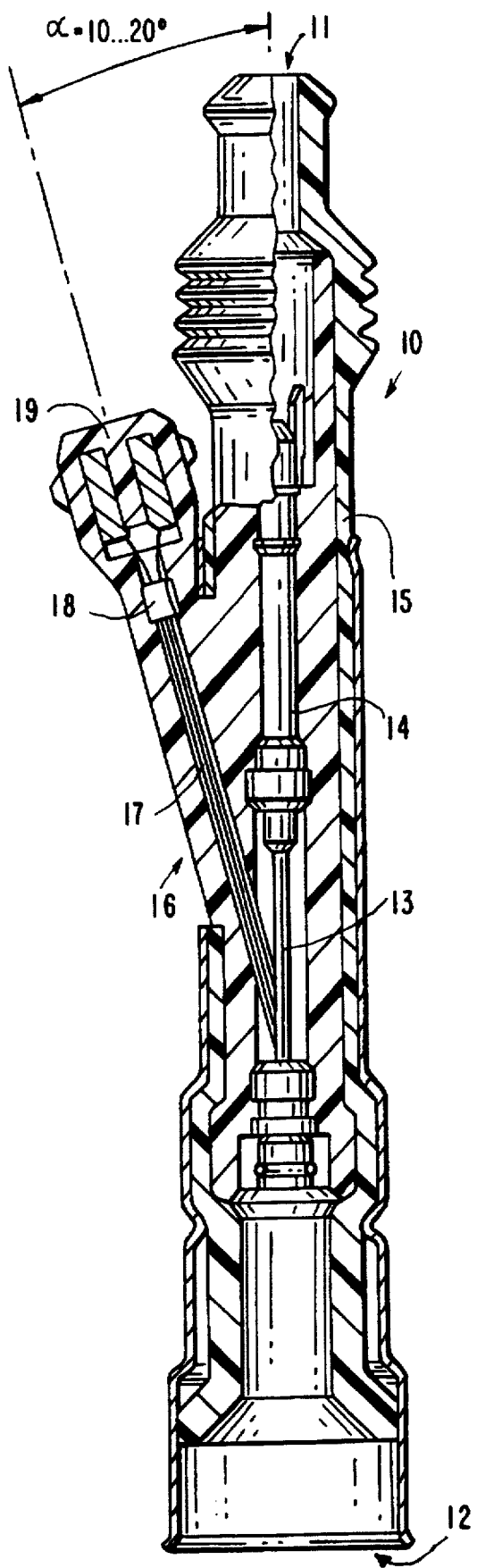

ARRANGEMENT FOR SWITCHING A HIGH-VOLTAGE SWITCH BY OPTICAL ENERGY

BACKGROUND OF THE INVNETION

The invention is based on an arrangement for switching a high-voltage switch by means of optical energy. From European Patent Disclosure EP 0 377 619, a high-voltage switch is already known that takes over the function of an ignition voltage distributor when the high-voltage distribution is in repose. This high-voltage switch is disposed between the high-voltage-side output of the ignition coil and the spark plug, and it comprises semiconductor elements that have light-sensitive zones. The light-sensitive zones may be triggered by light-emitting elements in such a way that they switch through at a predetermined time, for instance corresponding to the ignition sequence. In the known arrangement, fiber-optical light guides or light-emitting diodes are disposed facing the light-sensitive zones of the high-voltage switch. Such an arrangement requires a relatively large amount of space when installed in an ignition system. From German Patent DE 41 39 823, an arrangement of the light-emitting to light-sensitive element is known in which the light-emitting element is a light-emitting diode, and the light-transmitting element comprises a number of photoconductive glass fibers melted together. The cross sections of the light inlet face and the light exit face of the optical fiber rod are adapted here to the form of the facing light-emitting and the light-sensitive optoelectronic element, respectively. To that end, the light exit face of the light-transmitting optical fiber rod is reshaped from the originally round cross section of the light inlet face facing the light-emitting diode to a linear narrow cross section facing the rodlike optoelectronic semiconductor switch. For deforming the cross section, the optical fiber rod is heated, shaped, and then in its new shape cooled down again. In other words, a plurality of work steps are necessary.

SUMMARY OF THE INVENTION

The arrangement according to the invention has the advantage over the prior art that by obliquely bringing the light-transmitting element to the longitudinal extension of the semiconductor switch, space-saving mounting of the semiconductor switch and the light-transmitting element is possible.

It is especially advantageous that by the use of a rodlike fiber-optical light guide or optical fiber rod as the light-transmitting element, the angle between the longitudinal axis of the light-transmitting element and the longitudinal axis of the high-voltage switch can be chosen to be very small. The beveling of the light-transmitting element on the side toward the high-voltage switch, so that an elliptical cross-sectional face is created, has the advantage that the light-transmitting element rests flatly against the circumferential face of the high-voltage switch, and as a result the light energy can be carried very precisely to predeterminable regions of the high-voltage switch. As a result, in the final analysis, no additional work steps are needed to adapt the cross section of the light-transmitting element to the shape of the high-voltage switch. Because of the integration of the high-voltage switch and the light-transmitting element in the spark plug connector, there is no need to additional mounting of the high-voltage switch with the light-transmitting element on the cylinder head or ignition coil, for instance. The spark plug connector can thus be pre-mounted in finished form and then installed in its complete form, which makes for better handling since there is no need to mount still additional individual parts in the course of manufacturing an engine.

BRIEF DESCRIPTION OF THE DRAWING

An exemplary embodiment of the invention is shown in the drawing and described in further detail in the ensuing description. The sole drawing figure shows a spark plug connector in section, with the arrangement according to the invention of a high-voltage break-over diode and lighttransmitting element.

DESCRIPTION OF THE PREFERRED EMBODIMENT

The drawing shows a spark plug connector 10, shown partly cutaway. On one end, identified by reference numeral 11, this spark plug connector 10 is connected to the high-voltage cable, not shown. The opposite end 12 of the spark plug connector 10 has a cylindrical opening, which is slipped onto the spark plug, not shown. The internal structure of the spark plug connector is substantially equivalent to that of a conventional spark plug connector. The sole difference is the building in of the optoelectronic semiconductor switch 13 in the longitudinal direction of the rotationally symmetrical longitudinal axis of the spark plug connector. An interference-suppression resistor 14 is disposed between the terminal for the high-voltage cable 11 and the optoelectronic semiconductor switch 13. The spark plug connector 10 has a tubular housing 15. An opening 16 is provided in this tubular housing 15, in the region of the optoelectronic semiconductor switch, through which opening a light guide or optical fiber 17 is brought to the optoelectronic semiconductor switch 13. The end of the optical fiber rod or optical fiber 17 contacting the optoelectronic semiconductor switch is cut off obliquely, so that the longitudinal axis of the optical fiber rod or optical fiber and the rotationally symmetrical longitudinal axis of the spark plug connector form an angle $\alpha$ of from 5° to 20°. Mounted on the end of the optical fiber rod or optical fiber 17 remote from the optoelectronic semiconductor switch is a light-emitting diode, which is put in contact with a voltage supply, not shown, via a suitable plug. Reference numeral 19 represents the part toward the spark plug of the plug connection for contacting the light-emitting diode 18. The optical fiber rod or optical fiber 17 is brought, with its obliquely cut, elliptical cross-sectional face, only to a portion of the optoelectronic semiconductor switch 13. Thus only a portion of the optoelectronic semiconductor switch is illuminated and switched through by means of light energy.

The function of this spark plug connector is equivalent to the function of an ignition voltage distributor. If the high-voltage switch is not lighted when the ignition voltage is applied, then the entire break-over diode cascade blocks. If then the light-emitting diode 18 is triggered in accordance with the ignition sequence, then the portion of the optoelectronic high-voltage switch 13 to which the light energy is carried is switched through, and the entire cascade fires, so that the high voltage is switched through to the spark plug.

This entire construction can be integrated with the spark plug connector, so that only contacting of the light-emitting diode 18 then needs to be done once the spark plug connector has been built into the engine.

Naturally this integration is possible in spark plug connectors of different types as well. For instance, the spark plug connector may be T-shaped, in order to make the connection with the next spark plug connector to it. At the same time, there are many possible ways to embody the connection of the light-emitting diode with the light guide or optical fiber.

We claim:

1. An arrangement for switching an optoelectronic high-voltage switch by means of optical energy, the arrangement comprising semiconductor means which at a predetermined voltage change abruptly to a conducting state; a light-emitting element; a light-transmitting element which is disposed between said light-emitting element and the optoelectronic high-voltage switch, said light-transmitting element being arranged so that an angle formed by a longitudinal axis of the high-voltage switch and a longitudinal axis of said light-transmitting element is between 5° and 20°.

2. An arrangement as defined in claim 1, wherein said light-transmitting element is a light guide.

3. An arrangement as defined in claim 1, wherein said light-transmitting element is an optical fiber rod.

4. An arrangement as defined in claim 1, wherein said light-transmitting element has a beveling on an end of said light-transmitting element facing the optoelectronic high-voltage switch, so that a resultant elliptical cross-sectional face of said light-transmitting element rests against a circumferential face of the optoelectronic high-voltage switch.

5. An arrangement as defined in claim 1, and further comprising a spark-plug connector, the optoelectronic high-voltage switch being integrated with said spark-plug connector and arranged so that a longitudinal axis of the optoelectronic high-voltage switch is located in a direction of a longitudinal axis of said spark plug connector.

6. An arrangement as defined in claim 1; and further comprising a spark plug connector, said light transmitting element being integrated with said spark plug connector.

* * * * *